United States Patent
Choi et al.

(10) Patent No.: US 8,420,423 B2
(45) Date of Patent: Apr. 16, 2013

(54) ORGANIC LIGHT-EMITTING DISPLAY APPARATUS AND METHOD OF MANUFACTURING THE SAME

(75) Inventors: Jong-Hyun Choi, Yongin (KR); Dae-Hyun No, Yongin (KR)

(73) Assignee: Samsung Display Co., Ltd, Yongin, Gyeonggi-Do (KR)

( * ) Notice: Subject to any disclaimer, the term of this patent is extended or adjusted under 35 U.S.C. 154(b) by 14 days.

(21) Appl. No.: 13/064,239

(22) Filed: Mar. 14, 2011

(65) Prior Publication Data
US 2011/0241000 A1 Oct. 6, 2011

(30) Foreign Application Priority Data
Mar. 30, 2010 (KR) .................. 10-2010-0028596

(51) Int. Cl.
*H01L 21/00* (2006.01)
(52) U.S. Cl.
USPC .................................................... 438/39
(58) Field of Classification Search .............. 438/39
See application file for complete search history.

(56) References Cited

U.S. PATENT DOCUMENTS

| 7,510,455 | B2 | 3/2009 | Suzuki |
| 7,538,490 | B2 | 5/2009 | Maeda et al. |
| 7,973,319 | B2 * | 7/2011 | Kashiwabara et al. ......... 257/79 |
| 2009/0295282 | A1 * | 12/2009 | Yoon et al. .................... 313/504 |
| 2012/0064642 | A1 * | 3/2012 | Huang et al. .................... 438/15 |

FOREIGN PATENT DOCUMENTS

| JP | 2006-269329 A | 10/2006 |
| JP | 2006-302748 A | 11/2006 |
| KR | 10-2005-0067055 A | 6/2005 |

* cited by examiner

*Primary Examiner* — Charles Garber
*Assistant Examiner* — Andre' C Stevenson
(74) *Attorney, Agent, or Firm* — Lee & Morse, P.C.

(57) ABSTRACT

An organic light-emitting display apparatus includes a planarization layer, a plurality of group electrode layers having different numbers of layers on the planarization layer and including a first group electrode layer having a metal layer, a reflective layer, a first transparent conductive layer, a second transparent conductive layer, and a third transparent conductive layer sequentially stacked, a second group electrode layer having the metal layer, the reflective layer, the first transparent conductive layer, and the third transparent conductive layer sequentially stacked, and a third group electrode layer having the metal layer, the reflective layer, and the first transparent conductive layer sequentially stacked, an intermediate layer on the first group electrode layer, the second group electrode layer, and the third group electrode layer, and including at least one organic light-emitting layer, and a second electrode layer on the intermediate layer.

20 Claims, 7 Drawing Sheets

ORGANIC LIGHT-EMITTING DISPLAY APPARATUS AND METHOD OF MANUFACTURING THE SAME

BACKGROUND

1. Field

Example embodiments relate to an organic light-emitting display apparatus and a method of manufacturing the same. More particularly, example embodiments relate to an organic light-emitting display apparatus that is simply manufactured and has high display quality, and a method of manufacturing the organic light-emitting display apparatus.

2. Description of the Related Art

Organic light-emitting display apparatuses are self-emitting display apparatuses which emit light by applying a voltage to a thin film layer including an anode, a cathode, and an organic light-emitting layer disposed between the anode and the cathode, so that electrons and holes recombine with each other in the organic light-emitting layer. Organic light-emitting display apparatuses have been spotlighted as the next generation display apparatuses due to their lighter and thinner design, wider viewing angle, faster response times, and lower power consumption, e.g., as compared to cathode ray tube (CRT) monitors or liquid crystal displays (LCDs).

Full color organic light-emitting display apparatuses may emit light having different wavelengths according to different pixels, e.g., according to red, green, and blue pixels. As such, an optical resonance structure for changing an optical path between a transparent layer, e.g., a translucent mirror, and a reflective layer in each pixel according to the wavelength of emitted light may be implemented.

SUMMARY

Embodiments are therefore directed to an organic light-emitting display apparatus and a method of manufacturing the same, which substantially overcome one or more of the problems due to the limitations and disadvantages of the related art.

It is therefore a feature of an embodiment to provide an organic light-emitting display apparatus that is simply manufactured and has high display quality, and a method of manufacturing the organic light-emitting display apparatus.

At least one of the above and other features and advantages may be realized by providing a method of manufacturing an organic light-emitting display apparatus including forming a planarization layer on a substrate, forming a plurality of group electrode layers having different numbers of layers on the planarization layer, the plurality of group electrode layers being spaced apart from one another by a predetermined distance and including a first group electrode layer having a metal layer, a reflective layer, a first transparent conductive layer, a second transparent conductive layer, and a third transparent conductive layer sequentially stacked in the stated order, a second group electrode layer having the metal layer, the reflective layer, the first transparent conductive layer, and the third transparent conductive layer sequentially stacked in the stated order, and a third group electrode layer having the metal layer, the reflective layer, and the first transparent conductive layer sequentially stacked in the stated order, forming an intermediate layer on the first group electrode layer, the second group electrode layer, and the third group electrode layer, and including at least one organic light-emitting layer, and forming a second electrode layer on the intermediate layer.

The organic light-emitting display apparatus may include a plurality of pixels, each of which has first electrode layers, a second electrode layer, and an organic light-emitting layer disposed between the first electrode layers and the second electrode layer, wherein each of the plurality of pixels emits light having wavelengths that vary according to thicknesses of the first electrode layers, the method further including sequentially forming a planarization layer, a metal layer, a reflective layer, a first transparent conductive layer, and a second transparent conductive layer in the stated order on a substrate, coating a first photoresist on the second transparent conductive layer to form first photoresist patterns having two different thicknesses by using a first photo mask, and etching the reflective layer, the first transparent conductive layer, and the second transparent conductive layer into a plurality of separate stack structures each including the reflective layer, the first transparent conductive layer, and the second transparent conductive layer, exposing the second transparent conductive layers of some of the plurality of stack structures by removing the first photoresist patterns formed on the some of the plurality of stack structures, removing portions of the metal layer exposed between the first transparent conductive layer and the second transparent conductive layer by using the second transparent conductive layers exposed from the some of the stack structures and a residual first photoresist pattern remaining on the stack structure other than the some of the stack structures as masks, removing the second transparent conductive layers exposed from the some of the stack structures, and removing the residual first photoresist pattern.

The planarization layer may be formed on a plurality of thin film transistors disposed on the substrate.

The metal layer may be formed to include at least one of titanium (Ti), molybdenum (Mo), poly-indium tin oxide (ITO), chromium (Cr), nickel (Ni), and cobalt (Co).

The reflective layer may be formed to include at least one of aluminum (Al), silver (Ag), gold (Au), and platinum (Pt).

The first photo mask may be a half-tone mask.

Exposing the second transparent conductive layers may include removing the first photoresist patterns formed on the first preliminary stack structures by using plasma ashing.

Using plasma ashing may include using oxygen ($O_2$) plasma.

Removing of the portions of the metal layer may include removing the portions of the metal layer by using wet etching using an acid-based etchant.

Removing of the portions of the metal layer may include removing the portions of the metal layer by using plasma dry etching.

The first transparent conductive layer and the second transparent conductive layer may have different etching rates.

The first transparent conductive layer and the second transparent conductive layer may include materials selected from poly-ITO, amorphous ITO, indium gallium oxide (IGO), and aluminum zinc oxide (AZO) in an order of which an etching rate increases.

Removing of the second transparent conductive layers may include etching the second transparent conductive layers by selectively etching the first transparent conductive layer and the second transparent conductive layer.

Removing the residual first photoresist pattern may include forming stack structures spaced apart from each other by a predetermined distance and having different thicknesses, the stack structures including a first group electrode with a first thickness and having the metal layer, the reflective layer, the first transparent conductive layer, and the second transparent conductive layer, and a second group electrode with a second thickness and having the metal layer, the reflective layer, and the first transparent conductive layer.

The method may further include forming a third transparent conductive layer and a second photoresist on a resultant structure obtained from removing the residual first photoresist pattern, removing part of the third transparent conductive layer by using a second photo mask process using a second photo mask, and removing residual second photoresist patterns.

Removing the residual second photoresist patterns may include forming stack structures spaced apart from each other by a predetermined distance and having different thicknesses, the stack structures including a first group electrode with a first thickness and having the metal layer, the reflective layer, the first transparent conductive layer, the second transparent conductive layer, and the third transparent conductive layer, a second group with a second thickness and having the metal layer, the reflective layer, the first transparent conductive layer, and the third transparent conductive layer, and a third group with a third thickness and having the metal layer, the reflective layer, and the first transparent conductive layer.

The first transparent conductive layer, the second transparent conductive layer, and the third transparent conductive layer may include materials selected from poly ITO, amorphous ITO, IGO, and AZO in the order of which an etching rate increases.

The method may further include forming a thin film layer including one or more organic light-emitting layers on a resultant structure obtained from the removing of the residual second photoresist patterns, and forming a second electrode layer on the thin film layer.

At least one of the above and other features and advantages may also be realized by providing an organic light-emitting display apparatus, including a planarization layer disposed on a substrate, a plurality of group electrode layers having different numbers of layers on the planarization layer, the plurality of group electrode layers being spaced apart from one another by a predetermined distance and including a first group electrode layer including a metal layer, a reflective layer, a first transparent conductive layer, a second transparent conductive layer, and a third transparent conductive layer sequentially stacked in the stated order, a second group electrode layer including the metal layer, the reflective layer, the first transparent conductive layer, and the third transparent conductive layer sequentially stacked in the stated order, and a third group electrode layer including the metal layer, the reflective layer, and the first transparent conductive layer sequentially stacked in the stated order, an intermediate layer disposed on the first group electrode layer, the second group electrode layer, and the third group electrode layer, and including at least one organic light-emitting layer, and a second electrode layer disposed on the intermediate layer.

The substrate may include a plurality of thin film transistors, and the metal layer in each group electrode layer is directly connected to one of the plurality of thin film transistors.

The at least one organic light-emitting layer may include a white light-emitting layer commonly formed on the first group electrode layer, the second group electrode layer, and the third group electrode layer.

The at least one organic light-emitting layer may include light-emitting layers of different colors respectively formed on the first group electrode layer, the second group electrode layer, and the third group electrode layer.

The planarization layer may include at least one material selected from the group consisting of polyimide, polyamide, acrylic resin, benzocyclobutene, and phenolic resin.

Each of the metal layers may include at least one material selected from the group consisting of Ti, Mo, poly-ITO, Cr, Ni, and Co.

Each of the reflective layers may include at least one material selected from the group consisting of Al, Ag, Au, and Pt.

The first transparent conductive layer, the second transparent conductive layer, and the third transparent conductive layer may be formed of materials selected from among poly-ITO, amorphous ITO, IGO, and AZO in an order of which an etching rate increases.

The second electrode layer may include a translucent electrode.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
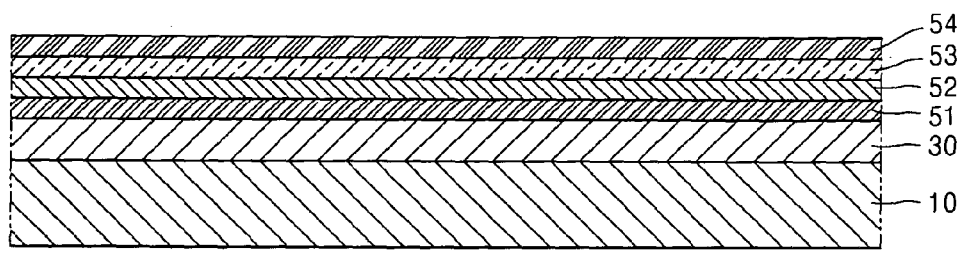
FIGS. 1 through 13 illustrate cross-sectional views of stages in a method of manufacturing an organic light-emitting display apparatus according to an embodiment.

Korean Patent Application No. 10-2010-0028596, filed on Mar. 30, 2010, in the Korean Intellectual Property Office, and entitled: "Organic Light-Emitting Display Apparatus and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

An organic light-emitting display apparatus according to an embodiment and a method of manufacturing the same will now be explained with reference to FIGS. 1 through 14. FIGS. 1 through 13 illustrate cross-sectional views of stages in a method of manufacturing an organic light-emitting display apparatus according to an embodiment, and FIG. 14 illustrates a cross-sectional view of the organic light-emitting display apparatus formed by the method of FIGS. 1 through 13.

Figure 14:
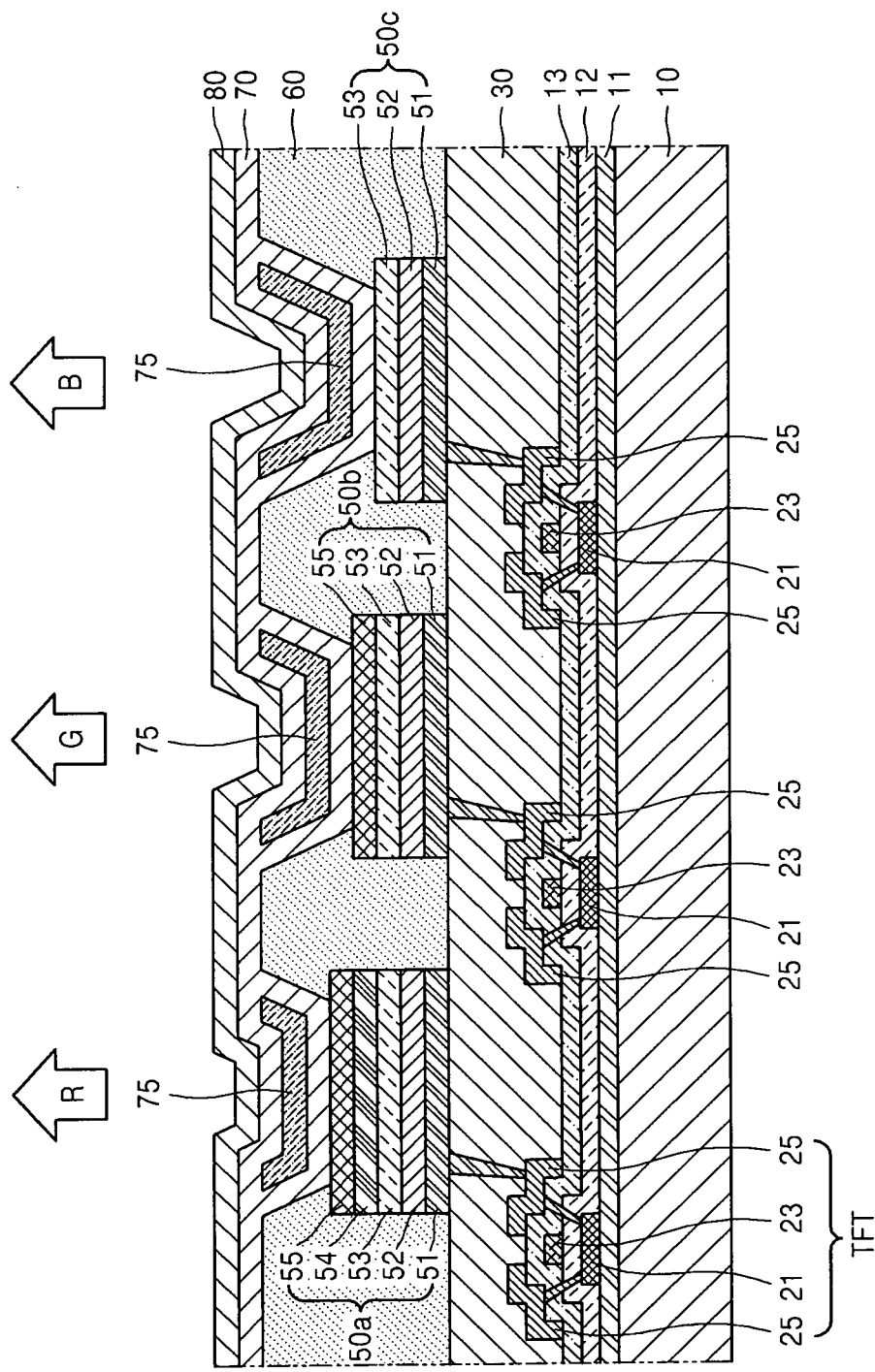
FIG. 14 illustrates a cross-sectional view of an organic light emitting display apparatus according to an embodiment.

Referring to FIG. 14, the organic light-emitting display apparatus may include a substrate 10 having a plurality of thin film transistors (TFTs), a planarization layer 30, first electrode layers 50a, 50b, and 50c having different thicknesses and disposed in a plurality of pixels, an intermediate layer 70 including organic light-emitting layers 75, and a second electrode layer 80. As illustrated in FIG. 14, the different thicknesses of the first electrode layers 50a, 50b, and 50c may be adjusted according to different arrangements of a metal layer 51, a reflective layer 52, a first transparent conductive layer 53, and a second transparent conductive layer 54 on the substrate 10.

In detail, referring to FIG. 14, the substrate 10 may be formed of a transparent plastic or a transparent glass material, e.g., a material including $SiO_2$ as a main component. Alternatively, the substrate 10 may be formed of an opaque material.

As further illustrated in FIG. 14, a buffer layer 11, e.g., formed of $SiO_2$ and/or $SiN_x$, may be formed on a top surface of the substrate 10. The buffer layer 11 may planarize the substrate 10 and prevent impurity elements from penetrating into the substrate 10.

An active layer 21 of each of the TFTs may be formed on the buffer layer 11 by using a semiconductor material. A gate insulating layer 12 may be formed on the buffer layer 11 to cover the active layer 21. The active layer 21 may be formed of an inorganic semiconductor material, e.g., amorphous silicon or polysilicon, or an organic semiconductor material. The active layer 21 includes a source region (not shown), a drain region (not shown), and a channel region (not shown) formed between the source region and the drain region.

A gate electrode 23 may be disposed on the gate insulating layer 12, and an interlayer insulating layer 13 may be formed on the gate insulating layer 12 to cover the gate electrode 23. Source and drain electrodes 25 may be disposed on the interlayer insulating layer 13, and one of the source and drain electrodes 25 may directly contact the metal layer 51 through a via hole (not shown). Although not shown, a passivation layer may be further disposed on the source and drain electrodes 25.

The planarization layer 30 may be disposed on the interlayer insulating layer 13 to cover the source and drain electrodes 25. The planarization layer 30 may reduce a difference between stepped portions of the substrate 10 including the plurality of TFTs, and may include at least one of, e.g., polyimide, polyamide, acrylic resin, benzocyclobutene, and phenolic resin.

Each of the gate insulating layer 12, the interlayer insulating layer 13, the passivation layer, and the planarization layer 30 may be formed of an insulating material in a single or multiple-layer structure including an inorganic material, an organic material, or an organic/inorganic composite material. The TFTs structures described above are exemplary and may have various other structures.

Referring to FIGS. 1 and 14, the metal layer 51 may be formed on, e.g., directly on, the planarization layer 30. The metal layer 51 may include at least one of, e.g., titanium (Ti), molybdenum (Mo), poly-indium tin oxide (poly-ITO), chromium (Cr), nickel (Ni), and cobalt (Co). The metal layer 51 improves contact stability between the planarization layer 30 and the reflective layer 52 that will be explained later. Also, the metal layer 51 prevents damage to the planarization layer 30 during plasma ashing of photolithography using a half-tone mask, as will be explained later.

The reflective layer 52 may be formed on, e.g., directly on, the metal layer 51, so the metal layer 51 may be between the reflective layer 52 and the planarization layer 30. The reflective layer 52 acts as a reflective mirror in an optical resonance structure. The reflective layer 52 may include at least one material of, e.g., aluminum (Al), silver (Ag), gold (Au), and platinum (Pt).

The first transparent conductive layer 53 and the second transparent conductive layer 54 may be sequentially stacked in the stated order on, e.g., directly on, the reflective layer 52. Each of the first transparent conductive layer 53 and the second transparent conductive layer 54 may include a transparent conductive material, e.g., at least one of poly-ITO, amorphous ITO, indium gallium oxide (IGO), and aluminum zinc oxide (AZO). Alternatively, each of the first and second transparent conductive layers 53 and 54 may include various other transparent conductive materials.

Each of the metal layer 51, the reflective layer 52, the first transparent conductive layer 53, and the second transparent conductive layer 54 may be deposited by various deposition methods, e.g., a plasma enhanced chemical vapor deposition (PECVD), an atmospheric pressure CVD (APCVD), and/or a low pressure CVD (LPCVD). As illustrated in FIG. 1, each of the metal layer 51, the reflective layer 52, the first transparent conductive layer 53, and the second transparent conductive layer 54 may be deposited to overlap all the pixels on the substrate 10. It is noted that for simplicity FIG. 1 does not illustrate layers between the substrate 10 and the planarization layer 30.

Figure 2:
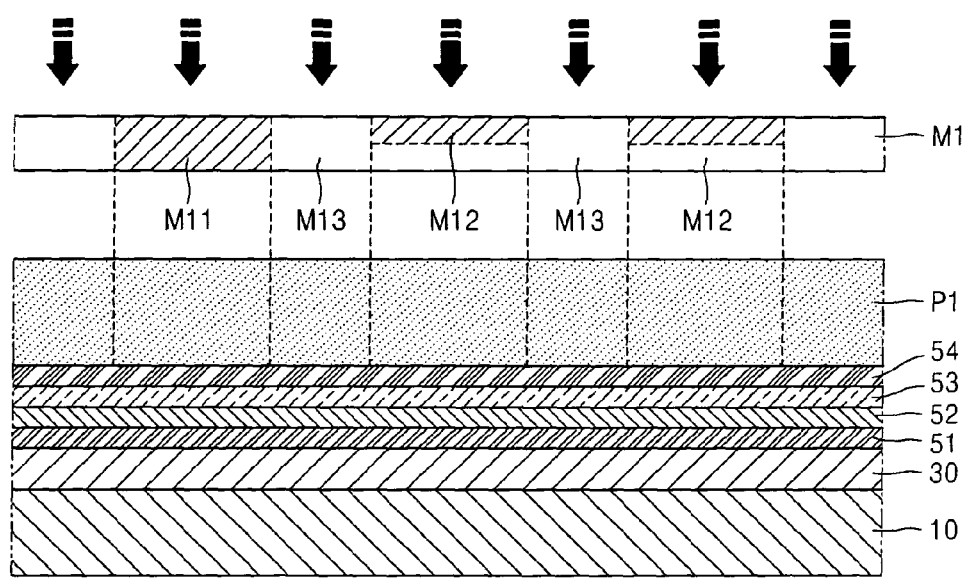

Referring to FIG. 2, once the metal layer 51, the reflective layer 52, the first transparent conductive layer 53, and the second transparent conductive layer 54 are deposited on the substrate 10, a first photoresist P1 is coated on a resultant structure of FIG. 1, i.e., on the second transparent conductive layer 54. Pre-baking or soft baking may be performed on the first photoresist P1 to remove a solvent.

In order to pattern the first photoresist P1, a first photo mask M1 having a predetermined pattern may be placed over the substrate 10. Light having a predetermined wavelength band is emitted to the first photoresist P1 to perform exposure.

The first photo mask M1 may be a half-tone mask, i.e., a half-tone mask M1, including a light-blocking portion M11, a half-transmitting portion M12, and a light-transmitting portion M13. The light-transmitting portion M13 substantially completely transmits light of a predetermined wavelength band therethrough, the light-blocking portion M11 substantially completely blocks light transmittance therethrough, and the half-transmitting portion M12 transmits only part of the light therethrough. The half-tone mask M1 illustrated in FIG. 2 is a conceptual diagram for explaining the function of each portion of the half-tone mask M1. The half-tone mask M1 having a predetermined pattern may be formed on a transparent substrate, e.g., a quartz (Qz) substrate. The light-blocking portion M11 may be formed by patterning a material, e.g., Cr or $CrO_2$, on the quartz substrate, and the half-transmitting portion M12 may adjust light transmission characteristics by adjusting a thickness or a composition ratio of at least one of, e.g., Cr, Si, Mo, Ta, and Al, on the quartz substrate.

Figure 3:
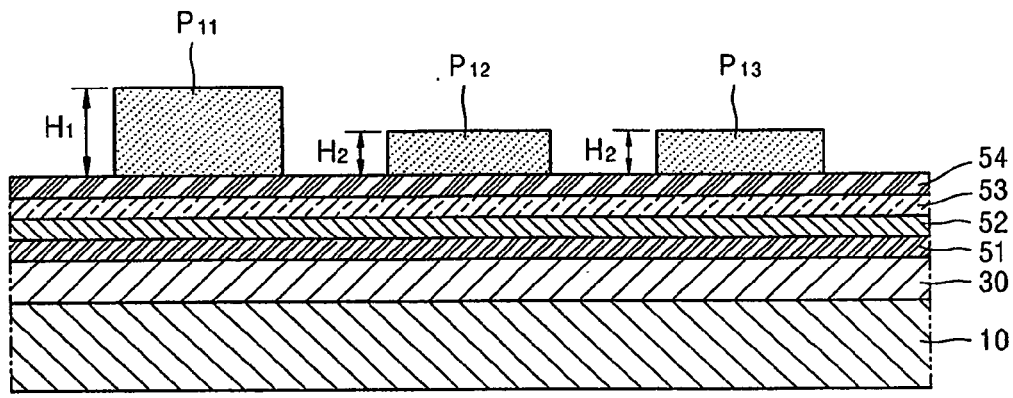

After light is emitted toward the photoresist P1 through the half-tone mask M1, portions of the first photoresist P1 exposed to the light are removed through development. Remaining patterns of the first photoresist P1 on the substrate 10 are illustrated in FIG. 3. Although a positive photoresist is used to remove the portions of the first photoresist P1 exposed to the light in FIG. 3, the present embodiment is not limited thereto and a negative photoresist may be used.

In detail, referring to FIG. 3, a portion of the first photoresist P1 corresponding to the light-transmitting portion M13 of the half-tone mask M1 is removed, e.g., completely removed to expose a portion of the second transparent conductive layer 54, and first photoresist patterns $P_{11}$, $P_{12}$, and $P_{13}$ corresponding to the light-blocking portion M11 and the half-transmitting portion M12 remain. Each of the thicknesses $H_2$ of the first photoresist portions $P_{12}$ and $P_{13}$ corresponding to the half-transmitting portion M12 is smaller than a thickness $H_1$ of the first photoresist pattern $P_{11}$ corresponding to the light-blocking portion M11.

Figure 4:
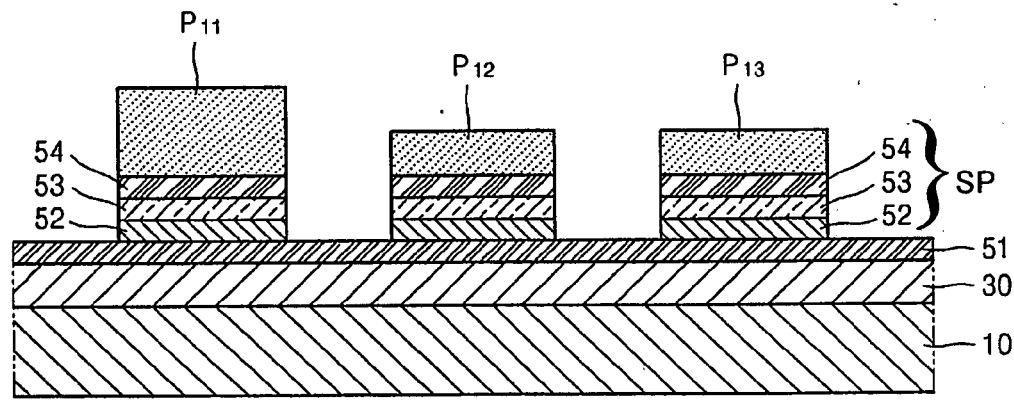

Referring to FIG. 4, by using the first photoresist patterns $P_{11}$, $P_{12}$, and $P_{13}$ as masks, the reflective layer 52, the first transparent conductive layer 53, and the second transparent conductive layer 54 formed on the metal layer 51 and the planarization layer 30 may be etched to form a plurality of preliminary stack structures SP. Each of the resultant stack structures SP may include the reflective layer 52, the first transparent conductive layer 53, and the second transparent conductive layer 54. Here, the reflective layer 52, the first transparent conductive layer 53, and the second transparent conductive layer 54 may be etched by wet etching or dry etching. As illustrated in FIG. 4, the metal layer 51 formed on the planarization layer 30 is not etched along with the reflective layer 52, the first transparent conductive layer 53, and the second transparent conductive layer 54.

Figure 5:
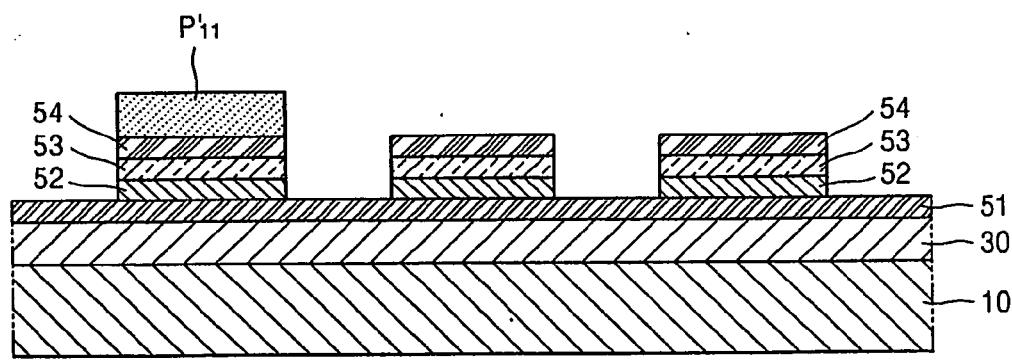

Referring to FIG. 5, at least an upper part of each of the first photoresist patterns $P_{11}$, $P_{12}$, and $P_{13}$ may be removed, i.e., each of the thicknesses $H_1$ and $H_2$ may be reduced. As a result, an upper surface of the second transparent conductive layer 54 in some of the preliminary stack structures SP may be exposed. For example, as illustrated in FIG. 5, the first photoresist patterns $P_{12}$ and $P_{13}$ having the thickness $H_2$ may be completely removed to expose the second transparent conductive layer 54. As further illustrated in FIG. 5, an upper part of the first photoresist pattern $P_{11}$ may be removed to form a pattern $P_{11}'$ on the second transparent conductive layer 54 with a reduced thickness smaller than the thickness $H_1$, e.g., the thickness $H_1$ may be reduced by the thickness $H_2$.

The upper parts of the first photoresist patterns $P_{11}$, $P_{12}$, and $P_{13}$ may be reduced, e.g., by ashing using plasma. For example, ashing by oxygen ($O_2$) plasma may be used. According to example embodiments, since the metal layer 51 is inserted between the planarization layer 30 and the reflective layer 52 before the ashing, the planarization layer 30 may be protected during the ashing. In other words, as the metal layer 51 may completely cover the planarization layer 30, the ashing process of the layers above the metal layer 51 may not affect the planarization layer 30. As such, an upper surface of the planarization layer 30, i.e., a surface facing away from the substrate 10, may be substantially flat.

In contrast, in a conventional manufacturing method of an organic light-emitting display apparatus, ashing using oxygen plasma may damage a planarization layer that covers the TFTs. As such, the ashing by oxygen plasma in the conventional manufacturing method may reduce flatness and uniformity of the planarization layer, thereby reducing operability and reliability of a first electrode thereon. In particular, if the organic light-emitting display apparatus is a top emission type organic light-emitting display apparatus, i.e., an apparatus in which an image is formed on a side opposite to the substrate, the state of a surface of the planarization layer may directly affect the first electrode layer.

Figure 6:
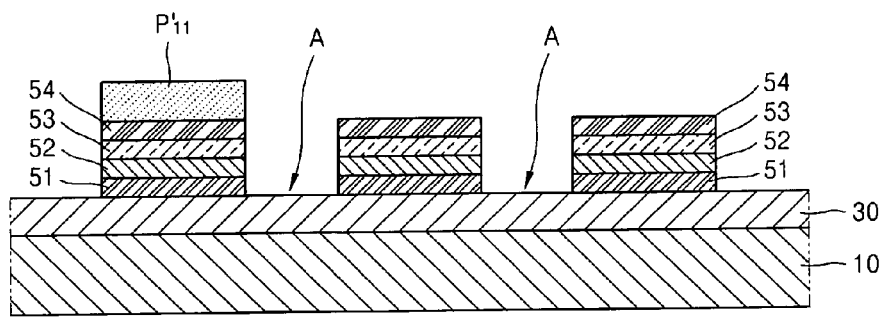

Referring to FIG. 6, by using the first photoresist pattern $P_{11}'$ remaining on an upper portion of the preliminary stack structure SP and the exposed second transparent conductive layers 54, portions of the metal layer 51 between the stacked structures SP, i.e., areas A in FIG. 6, may be removed to expose portions of the planarization layer 30. The portions of the metal layer 51 in the exposed areas A may be removed by wet etching using an acid-based etchant, e.g., nitric acid or hydrochloric acid. Alternatively, the portions of the metal layer 51 in the exposed areas A may be removed by plasma dry etching. As such, each preliminary stack structure SP may include the metal layer 51 as a bottom layer.

According to the method of manufacturing the organic light-emitting display apparatus of FIGS. 1 through 6, contact stability between the reflective layer 52 and the metal layer 51, as well as contact stability between the planarization layer 30 and the metal layer 51, may be improved. Further, the planarization layer 30 may be protected during plasma ashing of photolithography using a half-tone mask by which part of the thickness of the first photoresist P1 is removed.

Figure 7:
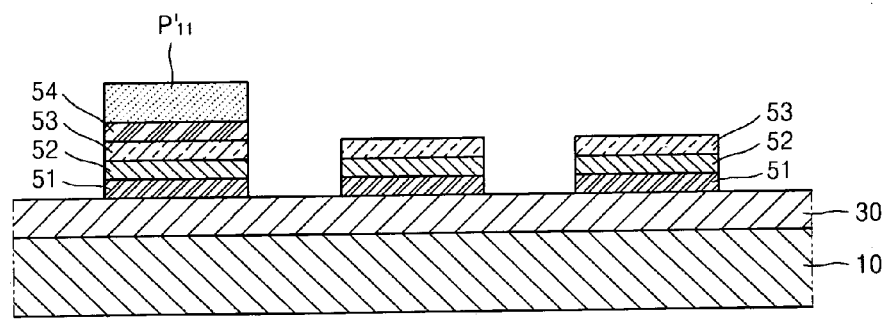

Referring to FIG. 7, the exposed second transparent conductive layers 54 on some of the stack structures may be removed. The second transparent conductive layers 54 may be etched by using an etchant having an etching selectivity with respect to the first transparent conductive layer 53, i.e., the etchant may have different etching rates in the first and second transparent conductive layers 53 and 54. That is, the first transparent conductive layer 53 and the second transparent conductive layer 54 may include transparent conductive materials having different etching rates.

For example, an etching rate may increase in the order of poly-ITO, amorphous ITO, IGO, and AZO among transparent conductive materials. Accordingly, if the first transparent conductive layer 53 includes poly-ITO, the second transparent conductive layer 54 may include one of amorphous ITO, IGO, and AZO, etching rates of which are higher than that of the poly-ITO.

Figure 8:
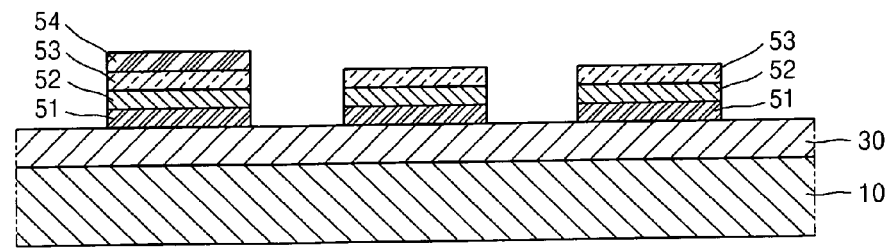

Referring to FIG. 8, as the first photoresist pattern $P_{11}'$ covers an upper portion of at least one stack structure, stack structures of different heights may be formed. In other words, the stack structures may be separated into two groups having different thicknesses on the substrate 10 and the planarization layer 30, and may be spaced apart from each other by a predetermined distance. A stack structure having a first thickness may include the metal layer 51, the reflective layer 52, the first transparent conductive layer 53, and the second transparent conductive layer 54, and a stack structure having a second thickness may include the metal layer 51, the reflective layer 52, and the first transparent conductive layer 53, i.e., without the second transparent conductive layer 54.

The stack structures having different thicknesses may function as first electrode layers of the organic light-emitting display apparatus. Although not shown, if an organic light-emitting layer and a second electrode layer are directly formed on the stack structures, the organic light-emitting display apparatus including the first electrode layers having different thicknesses may emit light having different resonant wavelengths. Although the organic light-emitting display apparatus for creating three different colors will now be explained below, it will be understood by one of ordinary skill in the art that example embodiments are not limited the number of colors and may be applied to any organic light-emitting display apparatus including first electrode layers having different thicknesses and capable of emitting light having different resonant wavelengths.

Figure 9:
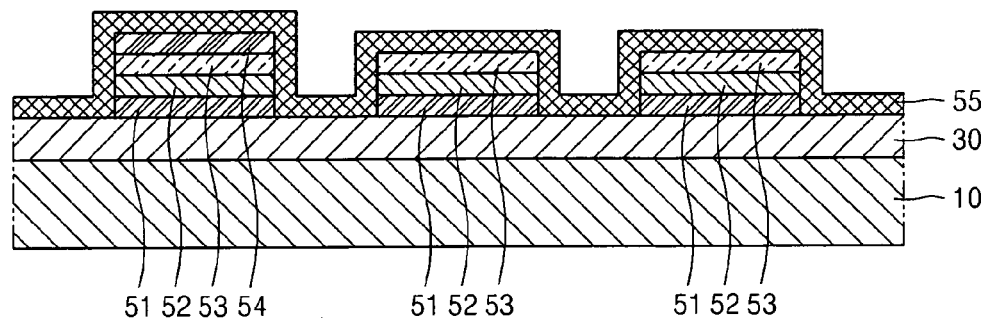

Referring to FIG. 9, a third transparent conductive layer 55 may be formed, e.g., conformally, on the resultant structure of FIG. 8. If the first transparent conductive layer 53 includes, e.g., poly-ITO, and the second transparent conductive layer 54 includes, e.g., amorphous ITO, the third transparent conductive layer 55 may include, e.g., IGO or AZO.

Figure 10:
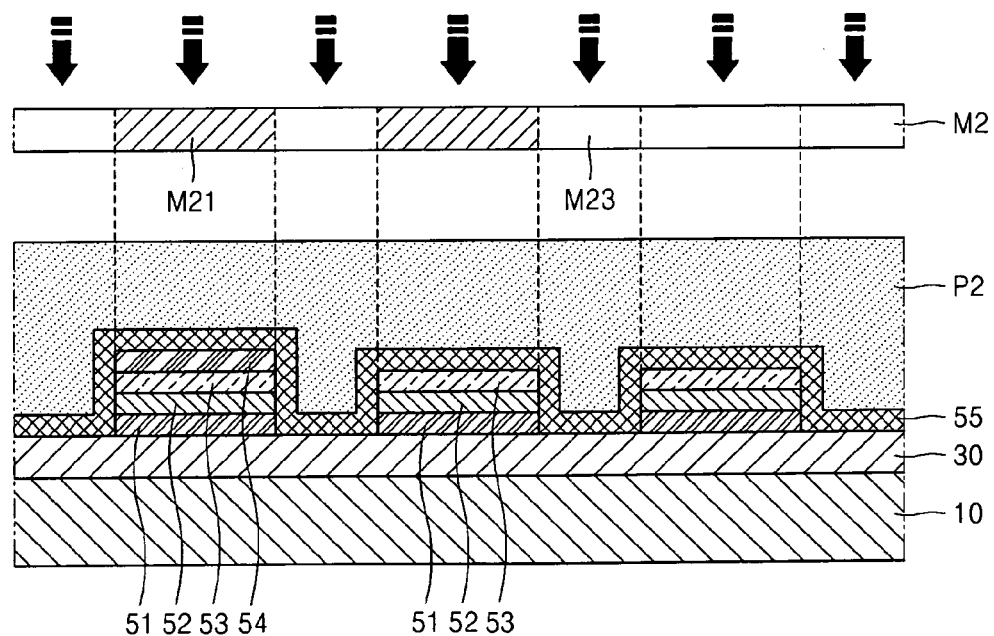

Referring to FIG. 10, a second photoresist P2 may be coated on the third transparent conductive layer 55. In order to pattern the second photoresist P2, a second photo mask M2 having a light-blocking portion M21 and a light-transmitting portion M23 is prepared. The second photo mask M2 is placed over the substrate 10 so that a pattern of the light-transmitting portion M23 corresponds to some of the stack structures having a lower thickness, and light having a predetermined wavelength band is emitted to the second photoresist P2 to perform exposure.

Figure 11:
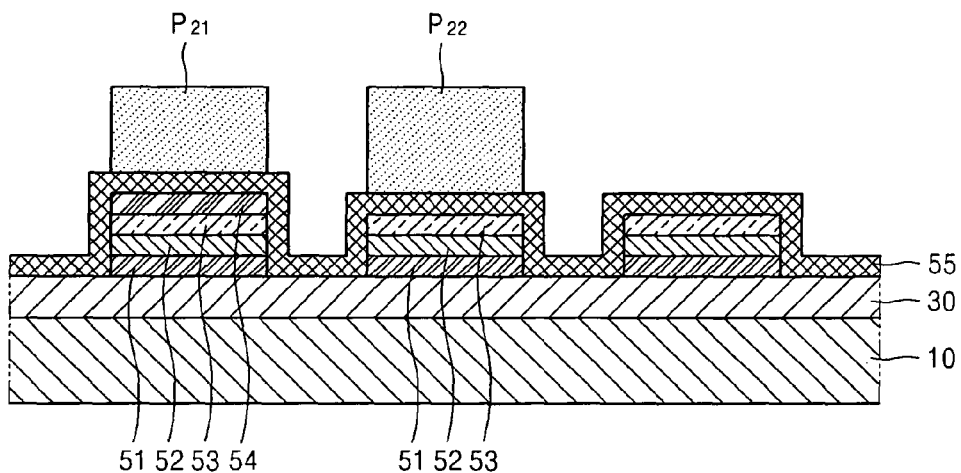

Referring to FIG. 11, after development is performed, a portion of the second photoresist P2 corresponding to the light-transmitting portion M23 of the second photo mask M2 is removed. As illustrated in FIG. 11, residual second photoresist patterns P21 and P22 corresponding to the light-blocking portion M21 may remain on the stack structures. It is noted that a width of the second photoresist patterns P21 and P22 may correspond to and overlap a width of the first transparent conductive layer 53.

Figure 12:
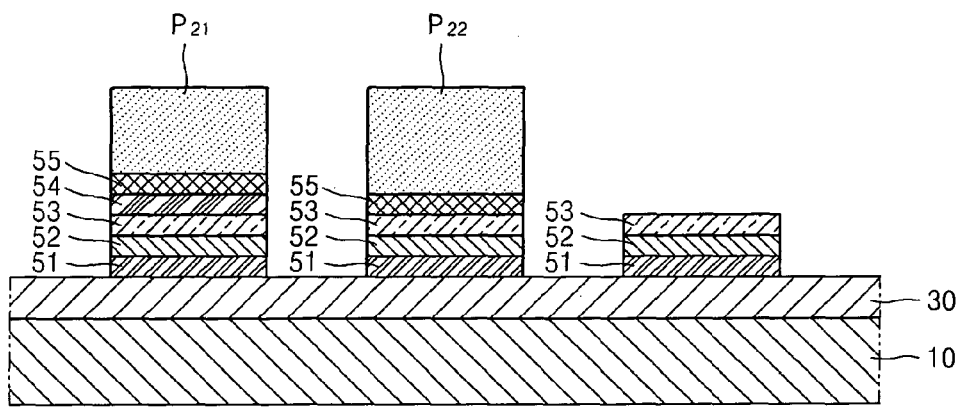

Referring to FIG. 12, portions of the third transparent conductive layer 55 may be removed by using the residual second photoresist patterns P21 and P22 as masks. The portions of the third transparent conductive layer 55 may be removed by wet etching or dry etching.

Figure 13:
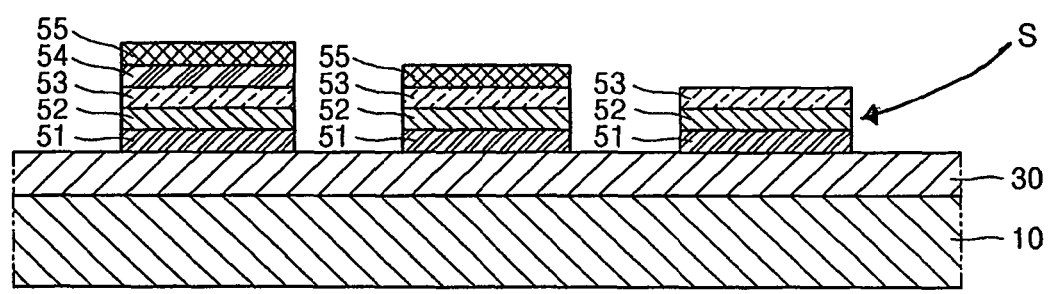

Referring to FIG. 13, the residual second photoresist patterns P21 and P23 remaining on upper portions of some of the stack structures may be removed. As a result, stack structures S, which may be separated into three groups having different thicknesses, may be formed on the substrate 10 and the planarization layer 30.

A stack structure having a first thickness may include the metal layer 51, the reflective layer 52, the first transparent conductive layer 53, the second transparent conductive layer 54, and the third transparent conductive layer 55. A stack structure having a second thickness may include the metal layer 51, the reflective layer 52, the first transparent conductive layer 53, and the third transparent conductive layer 55. A stack structure having a third thickness may include the metal layer 51, the reflective layer 52, and the first transparent conductive layer 53. The first through third thicknesses may be different from each other. The stack structure having the first thickness, the stack structure having the second thickness, and the stack structure having the third thickness function as first electrode layers with different thicknesses of the organic light-emitting display apparatus. Referring to FIG. 14, the stack structure having the first thickness is referred to as the first group electrode layer 50a, the stack structure having the second thickness is referred to as the second group electrode layer 50b, and the stack structure having the third thickness is referred to as the third group electrode layer 50c.

Referring to FIG. 14, an insulating layer 60 may be coated on the first group electrode layer 50a, the second group electrode layer 50b, and the third group electrode layer 50c, and may be patterned to expose portions of the first group electrode layer 50a, the second group electrode layer 50b, and the third group electrode layer 50c. The insulating layer 60 may be formed around the first group electrode layer 50a, the second group electrode layer 50b, and the third group electrode layer 50c to have an increasing distance between the second electrode layer 80 and a respective one of the first, second, and third group electrode layers 50a, 50b, and 50c. The insulating layer 60 may cover edges of the first, second, and third group electrode layers 50a, 50b, and 50c, thereby preventing an electric field from concentrating on the edges of the first, second, and third group electrode layers 50a, 50b, and 50c. Accordingly, the insulating layer 60 may act as a pixel defining layer (PDL) for preventing a short-circuit between the second electrode layer 80 and each of the first, second, and third group electrode layers 50a, 50b, and 50c. The second electrode layer 80 may be a counter electrode.

The intermediate layer 70 including the organic light-emitting layers 75 and the second electrode 80 may be formed in the stated order on each of the first, second, and third group electrode layers 50a, 50b, 50c, and on the pixel defining layer 60.

The organic light-emitting layers 75 emit light by being electrically driven by the second electrode layer 80 and the first, second, and third group electrode layers 50a, 50b, and 50c. The organic light-emitting layers 75 may be used to emit white light. In this case, light having different wavelengths may be emitted thereby and thus light having different colors may be emitted according to pixels and a resonance distance between the reflective layer 52 of the first group electrode layer 50a and the second electrode layer 80, a resonance distance between the reflective layer 52 of the second group electrode layer 50b and the second electrode layer 80, and a resonance distance between the reflective layer 52 of the third group electrode layer 50c and the second electrode layer 80.

Alternatively, the organic light-emitting layer 75 may be used to emit color light, not white light, for each pixel. For example, the organic light-emitting display apparatus having higher display quality may be provided by forming a red light-emitting material, a green light-emitting material, and a blue light-emitting material respectively on the first, second, and third group electrode layers 50a, 50b, and 50c, and optimizing the resonance distance between the reflective layer 52 of the first group electrode layer 50a and the second electrode layer 80, the resonance distance between the reflective layer 52 of the second group electrode layer 50b and the second electrode layer 80, and the resonance distance between the reflective layer 52 of the third group electrode layer 50c and the second electrode layer 80 so as to correspond to colors of light.

The organic light-emitting layers 75 may be formed of a low molecular weight organic material or a high molecular weight organic material. If the organic light-emitting layers 75 are formed of a low molecular weight organic material, the intermediate layer 70 may include a hole transport layer (HTL) and a hole injection layer (HIL) stacked closer to the first, second, and third group electrode layers 50a, 50b, and 50c around each of the organic light-emitting layers 75, and an electron transport layer (ETL) and an electron injection layer (EIL) stacked closer to the second electrode layer 80. Various other layers may be stacked if necessary. Examples of the low molecular weight organic material may include copper phthalocyanine (CuPc), N,N'-di(naphthalene-1-yl)-N,N'-diphenyl-benzidine (NPB), and tris-8-hydroxyquinoline aluminum (Alq3).

If the organic light-emitting layers 75 are formed of a high molecular weight organic material, the intermediate layer 70 may be formed in such a manner that only an HTL is disposed closer to the first, second, and third group electrode layers 50a, 50b, and 50c around each of the organic light-emitting layers 75. The HTL may be formed on the first, second, and third group electrode layers 50a, 50b, and 50c by inkjet printing or spin-coating using, e.g., poly-(2,4)-ethylene-dihydroxy thiophene (PEDOT) or polyaniline (PANI). Examples of the high molecular weight organic material may include poly-phenylenevinylene (PPV)-based high molecular weight organic material and polyfluorene-based high molecular weight organic material. These high molecular weight organic materials may form color patterns by using a typical thermal transfer method, e.g., laser, spin-coating, or inkjet printing.

The second electrode layer 80 may be deposited as a common electrode on the intermediate layer 70 including the organic light-emitting layers 75. In the organic light-emitting display apparatus of FIG. 14, the first, second, and third group electrode layers 50a, 50b, and 50c may be used as anode electrodes, and the second electrode layer 80 may be used as a cathode electrode. The present embodiment is not limited thereto, and the first, second, and third group electrode layers 50a, 50b, and 50c may be used as cathode electrodes and the second electrode layer 80 may be used as an anode electrode.

The second electrode layer 80 functioning as a transparent layer, e.g., a translucent mirror, in the optical resonance structure may be formed of a conductive material having a transmittance greater than a predetermined transmittance.

Although not shown, a sealing member and a moisture absorbent for protecting the organic light-emitting layers 75 from external moisture or oxygen may be further disposed on the second electrode layer 80.

The organic light-emitting display apparatus and the method of manufacturing the same according to example embodiments may include the metal layer 51 between the planarization layer 30 and the reflective layer 52. Therefore, contact stability between the planarization layer 30 and the reflective layer 52 may be improved, and the planarization layer 30 may be protected during plasma ashing of photolithography using a half-tone mask by which part of the thickness of the first photoresist P1 is removed. Also, since remaining portions of the metal layer 51 are removed by using the first transparent conductive layer 53 and the second transparent conductive layer 54 as metal masks and the first transparent conductive layer 53 and the second transparent conductive layer 54 are formed of materials having different etching rates, the second transparent conductive layer 54 may be simply etched. Accordingly, the method of manufacturing the organic light-emitting display apparatus may be simplified and the organic light-emitting display apparatus having high display quality and the manufacturing method thereof may be provided.

As described above, the flat panel display apparatus and the method of manufacturing the same according to the present invention have the following effects.

First, since a metal layer is inserted between a planarization layer and a reflective layer, contact stability between the planarization layer and the reflective layer may be improved.

Second, since resonance anodes having different thicknesses are formed by using a half-tone mask, a manufacturing process may be simplified.

Third, since the metal layer is inserted between the planarization layer and the reflective layer, the planarization layer may be protected during plasma ashing of photolithography using a half-tone mask by which part of the thickness of a photoresist is removed.

Fourth, since transparent conductive layers including resonance anodes having different thicknesses are formed of materials having different etching rates, the thicknesses of the resonance anodes may be simply adjusted.

Since the elements illustrated in the drawings may be enlarged or contracted for convenience of explanation, the present invention is not limited to the sizes or shapes of the elements illustrated in the drawings. Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing an organic light-emitting display apparatus, the method comprising:
    sequentially forming a planarization layer, a metal layer, a reflective layer, a first transparent conductive layer, and a second transparent conductive layer in the stated order on a substrate;
    patterning the reflective layer, the first transparent conductive layer, and the second transparent conductive layer through a photoresist pattern to define separate stack structures;
    removing the photoresist pattern by plasma ashing;
    patterning the metal layer, after the plasma ashing, to form the stack structures into a plurality of group electrode layers having different numbers of layers on the planarization layer, the plurality of group electrode layers being spaced apart from one another by a predetermined distance and including:
        a first group electrode layer having a metal layer, a reflective layer, a first transparent conductive layer, a second transparent conductive layer, and a third transparent conductive layer sequentially stacked in the stated order,
        a second group electrode layer having the metal layer, the reflective layer, the first transparent conductive layer, and the third transparent conductive layer sequentially stacked in the stated order, and
        a third group electrode layer having the metal layer, the reflective layer, and the first transparent conductive layer sequentially stacked in the stated order;
    forming an intermediate layer on the first group electrode layer, the second group electrode layer, and the third group electrode layer, and including at least one organic light-emitting layer; and
    forming a second electrode layer on the intermediate layer.

2. The method as claimed in claim 1, wherein the metal layer is formed to include at least one of titanium (Ti), molybdenum (Mo), poly-indium tin oxide (ITO), chromium (Cr), nickel (Ni), and cobalt (Co).

3. The method as claimed in claim 1, wherein the reflective layer is formed to include at least one of aluminum (Al), silver (Ag), gold (Au), and platinum (Pt).

4. The method as claimed in claim 1, wherein forming the first and second transparent conductive layers are formed of materials having different etching rates.

5. The method as claimed in claim 4, wherein the first transparent conductive layer is formed to have a lower etching rate than the second transparent conductive layer, the first and second conductive layers being formed of poly-ITO, amorphous ITO, indium gallium oxide (IGO), or aluminum zinc oxide (AZO).

6. The method as claimed in claim 1, wherein removing the photoresist pattern by plasma ashing is performed while the planarization layer is completely covered by the metal layer.

7. The method as claimed in claim 1, wherein patterning through the photoresist pattern includes using a half-tone mask.

8. The method as claimed in claim 1, wherein patterning the metal layer includes removing portions of the metal layer exposed between the stack structures by using exposed top surfaces of the stack structures.

9. A method of manufacturing an organic light-emitting display apparatus, the method comprising:
    sequentially forming a planarization layer, a metal layer, a reflective layer, a first transparent conductive layer, and a second transparent conductive layer on a substrate in the stated order;
    coating a first photoresist on the second transparent conductive layer to form first photoresist patterns having two different thicknesses by using a first photo mask;
    etching the reflective layer, the first transparent conductive layer, and the second transparent conductive layer by using the first photoresist patterns as a mask to form a plurality of separate preliminary stack structures, such that each preliminary stack structure includes the reflective layer, the first transparent conductive layer, and the second transparent conductive layer;

exposing the second transparent conductive layers in first preliminary stack structures by removing the first photoresist patterns from the first preliminary stack structures, such that a residual first photoresist pattern remains on at least one second preliminary stack structure;

removing portions of the metal layer exposed between the preliminary stack structures by using the exposed second transparent conductive layer in the first preliminary stack structures and the residual first photoresist pattern;

removing the exposed second transparent conductive layers from the first preliminary stack structures;

removing the residual first photoresist pattern, such that a plurality of group electrode layers having different numbers of layers and spaced apart from one another by a predetermined distance are formed on the planarization layer, the group electrode layers including:
- a first group electrode layer having the metal layer, the reflective layer, the first transparent conductive layer, the second transparent conductive layer, and the third transparent conductive layer,
- a second group electrode layer having the metal layer, the reflective layer, the first transparent conductive layer, and the third transparent conductive layer, and
- a third group electrode layer having the metal layer, the reflective layer, and the first transparent conductive layer;

forming an intermediate layer on the first group electrode layer, the second group electrode layer, and the third group electrode layer, and including at least one organic light-emitting layer: and forming a second electrode layer on the intermediate layer.

10. The method as claimed in claim 9, wherein using the first photo mask includes using a half-tone mask.

11. The method as claimed in claim 9, wherein exposing the second transparent conductive layers includes removing the first photoresist patterns formed on the first preliminary stack structures by using plasma ashing.

12. The method as claimed in claim 11, wherein using plasma ashing includes using oxygen ($O_2$) plasma.

13. The method as claimed in claim 9, wherein removing portions of the metal layer includes removing portions of the metal layer by wet etching using an acid-based etchant or by using plasma dry etching.

14. The method as claimed in claim 9, wherein removing the residual first photoresist pattern includes forming stack structures spaced apart from each other by a predetermined distance and having different thicknesses, the stack structures including:
- a first group electrode with a first thickness and having the metal layer, the reflective layer, the first transparent conductive layer, and the second transparent conductive layer, and
- a second group electrode with a second thickness and having the metal layer, the reflective layer, and the first transparent conductive layer.

15. The method as claimed in claim 9, further comprising:
forming a third transparent conductive layer and a second photoresist, after removing the residual first photoresist pattern, removing a part of the third transparent conductive layer via a second photo mask process using a second photo mask, and removing residual second photoresist patterns.

16. The method as claimed in claim 15, wherein removing the residual second photoresist patterns includes forming stack structures spaced apart from each other by a predetermined distance and having different thicknesses, the stack structures including:
- a first group electrode with a first thickness and having the metal layer, the reflective layer, the first transparent conductive layer, the second transparent conductive layer, and the third transparent conductive layer,
- a second group with a second thickness and having the metal layer, the reflective layer, the first transparent conductive layer, and the third transparent conductive layer, and
- a third group with a third thickness and having the metal layer, the reflective layer, and the first transparent conductive layer.

17. The method as claimed in claim 16, wherein the first transparent conductive layer, the second transparent conductive layer, and the third transparent conductive layer are formed of poly ITO, amorphous ITO, IGO, or AZO, such that an etching rate of the first through third transparent conductive layers increases.

18. A method of manufacturing an organic light-emitting display apparatus, the method comprising:
forming a planarization layer disposed on a substrate;
forming a plurality of group electrode layers having different numbers of layers on the planarization layer, the plurality of group electrode layers being spaced apart from one another by a predetermined distance and including:
- a first group electrode layer including a metal layer, a reflective layer, a first transparent conductive layer, a second transparent conductive layer, and a third transparent conductive layer sequentially stacked in the stated order,
- a second group electrode layer including the metal layer, the reflective layer, the first transparent conductive layer, and the third transparent conductive layer sequentially stacked in the stated order, and
- a third group electrode layer including the metal layer, the reflective layer, and the first transparent conductive layer sequentially stacked in the stated order;

forming an intermediate layer disposed on the first group electrode layer, the second group electrode layer, and the third group electrode layer, and including at least one organic light-emitting layer; and forming a second electrode layer disposed on the intermediate layer, wherein forming the plurality of group electrode layers includes patterning the reflective layer, the first transparent conductive layer, and the second transparent conductive layer, while the planarization layer is covered by the metal layer.

19. The method as claimed in claim 18, further comprising patterning the metal layer, only after patterning of the reflective layer, the first transparent conductive layer, and the second transparent conductive layer through a photoresist pattern is complete.

20. The method as claimed in claim 19, wherein, before patterning the metal layer, the photoresist pattern is removed by plasma ashing.

* * * * *